(12) United States Patent
Lan et al.

(10) Patent No.: US 8,741,199 B2
(45) Date of Patent: Jun. 3, 2014

(54) METHOD AND DEVICE FOR FULL WAFER NANOIMPRINT LITHOGRAPHY

(75) Inventors: Hongbo Lan, Qingdao (CN); Yucheng Ding, Qingdao (CN)

(73) Assignee: Qingdao Technological University, Qingdao (CN)

( * ) Notice: Subject to any disclaimer, the term of this patent is extended or adjusted under 35 U.S.C. 154(b) by 161 days.

(21) Appl. No.: 13/521,811

(22) PCT Filed: May 23, 2011

(86) PCT No.: PCT/CN2011/000878
§ 371 (c)(1),
(2), (4) Date: Jul. 12, 2012

(87) PCT Pub. No.: WO2012/083578
PCT Pub. Date: Jun. 28, 2012

(65) Prior Publication Data
US 2012/0299222 A1  Nov. 29, 2012

(30) Foreign Application Priority Data

Dec. 22, 2010 (CN) .......................... 2010 1 0600735
Dec. 22, 2010 (CN) .......................... 2010 2 0673702

(51) Int. Cl.
*B29C 33/46* (2006.01)
(52) U.S. Cl.
USPC ........... 264/313; 264/293; 264/299; 264/314; 264/496; 425/385; 425/383; 425/389; 425/388; 425/394
(58) Field of Classification Search
USPC .......... 264/293, 299, 313, 314, 496; 425/385, 425/383, 389, 388, 394
See application file for complete search history.

(56) References Cited

U.S. PATENT DOCUMENTS

| | | | |
|---|---|---|---|
| 2003/0197312 A1* | 10/2003 | Hougham et al. ............ 264/496 |
| 2006/0172031 A1 | 8/2006 | Babbs et al. | |
| 2007/0275114 A1 | 11/2007 | Cherala et al. | |
| 2008/0141862 A1* | 6/2008 | Xu et al. ......................... 95/246 |
| 2008/0160129 A1 | 7/2008 | Resnick et al. | |
| 2009/0194913 A1* | 8/2009 | Chang et al. .................. 264/447 |
| 2010/0072652 A1* | 3/2010 | GanapathiSubramanian et al. ............................. 264/101 |
| 2010/0072671 A1 | 3/2010 | Schmid et al. | |
| 2010/0320645 A1 | 12/2010 | Ganapathisubramanian et al. | |

FOREIGN PATENT DOCUMENTS

CN  1799808  7/2006
CN  101104318  1/2008

(Continued)

OTHER PUBLICATIONS

International Search Report and Written Opinion for PCT Application No. PCT/CN2011/000878, filed May 23, 2011, dated Sep. 20, 2011.

*Primary Examiner* — Amjad Abraham
*Assistant Examiner* — Ninh Le
(74) *Attorney, Agent, or Firm* — Knobbe Martens Olson & Bear LLP

(57) ABSTRACT

The present application relates to a full wafer nanoimprint lithography device comprises a wafer stage, a full wafer coated with a liquid resist, a demolding nozzle, a composite mold, an imprint head, a pressure passageway, a vacuum passageway and a UV light source. The present application also relates to an imprinting method using the full wafer nanoimprint lithography device comprises the following steps: 1) a pretreatment process; 2) an imprinting process; 3) a curing process; and 4) a demolding process. The device and the method can be used for high volume manufacturing photonic crystal LEDs, nano patterned sapphire substrates and the like in large scale patterning on the non-planar surface or substrate.

8 Claims, 4 Drawing Sheets

(56) References Cited

FOREIGN PATENT DOCUMENTS

| | | |
|---|---|---|
| CN | 101142743 | 3/2008 |
| CN | 101249938 | 8/2008 |
| CN | 101405087 | 4/2009 |
| CN | 101573659 | 11/2009 |
| TW | 201103721 | 2/2011 |
| WO | WO 2007/067469 | 6/2007 |
| WO | WO 2009147602 A2 * 12/2009 .............. C08L 83/04 |
| WO | WO 2011050817 A1 * 5/2011 ................ G03F 7/00 |

* cited by examiner

METHOD AND DEVICE FOR FULL WAFER NANOIMPRINT LITHOGRAPHY

CROSS-REFERENCE TO RELATED APPLICATIONS

This application is the U.S. National Phase under 35 U.S.C. §371 of International Application No. PCT/CN2011/000878 entitled METHOD AND DEVICE FOR FULL WAFER NANOIMPRINT LITHOGRAPHY, filed May 23, 2011, published as WO 2012/083578, which claims priority to Chinese Patent Application Nos. CN201010600735.X and CN201020673702.3, both filed Dec. 22, 2010; each of which is hereby incorporated by reference in its entirety.

FIELD OF INVENTION

The invention relates to the method and device for a full wafer nanoimprint lithography, which aims to the mass production of photonic crystal LEDs, and belongs to the technical field of micro-nano manufacturing and optoelectronic device manufacturing.

DESCRIPTION OF RELATED ART

Nanoimprint lithography (NIL) is a novel method of fabricating micro/nanometer scale patterns with low cost, high throughput and high resolution. Unlike traditionally optical lithographic approaches, which create pattern through the use of photons or electrons to modify the chemical and physical properties of the resist, NIL relies on direct mechanical deformation of the resist and can therefore achieve resolutions beyond the limitations set by light diffraction or beam scattering that are encountered in conventional lithographic techniques. NIL has prominent advantages in manufacturing large-area micro-nanostructures and complex three-dimensional micro-nanostructures. The demand on full wafer scale nanoimprint lithography process with large wafer size and whole field is more and more pressing with wide application of nanoimprint lithography in photonic crystal LEDs, high-density disk media (HDDs), optical components (waveguides, micro-optical lens and grating), micro-fluidic devices and other areas, meanwhile, the requirements on imprint area and resolution of pattern are also higher and higher. Currently, there are mainly two schemes of realizing large-area or full wafer scale nanoimprint lithography: firstly, step-and-repeat NIL is adopted; secondly, single step full water nanoimprint is utilized. The method of adopting full wafer NIL (Wafer-level or Full field) to produce micro/nano-structures over large areas has the outstanding advantages of high productivity, low cost, uniformity compared to step-and-repeat NIL. However, full wafer nanoimprint lithography process indeed also faces many new challenging issues: (1) How to exert uniform imprinting pressure over large areas. The inhomogeneous distribution of imprinting pressure can strongly affect the quality and accuracy of the imprinted patterns, imprint field size, as well as leading to crack of template or substrate made of brittle materials. Wafer size has been developed from 4 inch and 6 inch in early stage into to 8 inch, 12 inch (300 mm) up to the present, and 18 inch (450 mm) in the future. The increase of the wafer size indicates reduction of production cost per unit area and improvement in overall capacity. However, how to obtain uniform and homogeneous imprinting pressure on the full wafer field along with increasing wafer size is more and more difficult. The requirements on performance of imprint wafer stage and imprint mechanism are higher and higher. (2) How to reduce the imprinting pressure. The liquid resist should be rapidly and completely filled into the micro-nano cavity of the mold. The full wafer nanoimprint lithography needs larger imprinting pressure compared with Step-and-repeat NIL and small area imprinting process. Large imprinting pressure will cause the deformation of the mold. Deformation is a serious problem for the soft mold affecting the quality and accuracy of imprinted pattern, and even the failures of patterns replication. (3) How to eliminate the defect of the trapped air bubbles. How to eliminate the air bubble has been regarded as one of the most difficult problems faced by the full wafer NIL process, the existence of the air bubble will cause some defects on reproduced patterns. (4) Demolding is especially difficult. Larger demolding force is needed for the full wafer NIL process and large-area patterning, thereby easily damaging mold and replicated patterns. (5) The entire imprint area should obtain uniform and thin residual layer thickness. The uniform and thin residual layer thickness plays decisive role in realizing high-quality pattern transfer for full wafer scale NIL. In addition, the producing photonic crystal LEDs using the NIL is different from the traditional silicon-based nanoimprint process. That has the following characteristics: (1) Epitaxial wafer is not flat (non-flat or non-planar) with surface protrusion for a size of a few microns. Warpage or bow for tens of microns is the result of inconsistent expansion coefficient of epitaxial materials and substrate material, such as silicon carbide or sapphire and semiconductor materials with epitaxial growth, including GaN whose growth temperature is higher than 900° C. The two layers of material are actually like the bimetal plates, which can form warp structure similar to potato chips. The thermal stress also has hindered the use of the epitaxial wafer with larger size. Surface protrusion is a by-product of the epitaxial growth. Protrusions can be generated if the lattice of the substrate and the semiconductor material cannot be exactly matched. (2) Wafer surface is not very clean, there may be contaminated. (3) The future development trend is to use large-size substrates, such as 4 inch or 6 inch wafers, in order to save the cost of MOCVD epitaxial growth in the production of high bright LEDs. However, that will lead to more obvious bending of large-size epitaxial wafers, forcible utilization of methods such as vacuum suction, etc. to compensate for the bending in the subsequent lithography process in order to exchange for high-resolution may cause the substrate fracture. (4) Clean rooms of producing LEDs are designed to be higher than level 1000 currently, and particulate pollutants in the air will greatly reduce the finished product yield of the imprint structure and damage the mold if common nanoimprint lithography technology is used. Manufacturers will have to pay a high price for reforming production environment. As for patterning photonic crystal LEDs, a new full wafer nanoimprint lithography process should be urgently developed to meet the requirements of the mass production of photonic crystal LEDs, as well as large-area patterning on the non-planar substrates or surfaces.

INVENTION CONTENTS

The objective of the invention is to resolve the following issues for implementing the full wafer NIL process, e.g., applying uniform imprinting pressure over large areas, the low imprinting pressure and demolding force needed, elimination of the defect of trapped air bubbles, uniform and thin residual layer thickness, the effective demolding method over a large area. Moreover, for patterning LEDs epitaxial wafers, the full wafer NIL process still faces some challenges: non-planar epitaxial wafers or substrates, the contaminant on the epitaxial wafer, and brittle or fragile wafers or substrates. Various existing NIL processes cannot well meet these requirements of producing photonic crystal LEDs and nano patterned sapphire substrate (NPSS). Therefore, the goal of the invention is to offer the method and device for a full wafer scale nanoimprint lithography which have the ability to implement high volume manufacture of photonic crystal LEDs and NPSS at low cost and high throughput, as well as large-area patterning on the non-planar substrates.

The basic principle of the full wafer nanoimprint lithography process proposed by the invention is as follows: A transparent flexible mold with three layer composite structures is introduced. The imprinting process applies (adopts) the method of gradually and uniformly micro-contacting and imprinting from the central position to two side of the mold under the common effect of gas-assisted imprinting pressure and the capillary force. The demolding process is based on the continuous 'peel-off' solution from two sides to the center of the mold under the joint action of vacuum suction and level detaching force. The imprint process and demolding process take the mold center as the axis of symmetry, the mold is exerted uniform and symmetric pressure, the imprint and demolding processes are carried out at the same time on two sides, thereby greatly improving the productivity and the quality of the imprinted patterns.

The invention adopts the following technique solutions in order to achieve the above objectives:

A full wafer nanoimprint lithography device comprises a wafer stage, a wafer coated with a liquid resist, a demolding nozzle, a composite mold (template, or stamp), an imprint head, a pressure passageway (positive pressure), a vacuum passageway (negative pressure) and a UV light source. The composite mold is fixed on the underside of the working table-board of the imprint head. The demolding nozzle is arranged at the side of the lower portion of the mold. The pressure passageway and the vacuum passageway are connected with the air intakes on two sides of the working table-board of the imprint head. The full wafer coated with resist is placed on vacuum chuck on the stage wafer. The UV light source is arranged on the working table-board of the imprint head.

The composite mold is a transparent and flexible mold with three-layer hybrid structures, and comprises a structure layer, an elastic layer and a support layer, wherein the structure layer contains the nanostructures or features which need be transferred. The elastic layer is located above in structure layer. The support layer is located above the elastic layer. The structure layer and support layer have same size, the size of the elastic layer is bigger than the size of the structure layer and support layer. The elastic layer is fixed on the lower portion of the working table-board of the imprint head.

The thickness of the structure layer is 100-200 microns. The thickness of the elastic layer is 400-700 microns. The thickness of the support layer is 100-200 microns. The structure layer and support layer are made of hard PDMS (h-PDMS), its elastic modulus is three to five times of the traditional soft PDMS (s-PDMS) used in the elastic layer. The elastic layer is made of soft PDMS with excellent longitudinal bending deformation property, the young's modulus range is from 1 to 10 N/mm.

The imprint head is composed of a working table-board (valve template) and an adjustment component. The working table-board has following functions: distributing the pressured air and vacuum air; connecting the mold and the imprint mechanism implementing the vertical movement along z direction. A set of grooves (trenches) is arranged at the bottom of the working table-board to fix the mold.

An imprint method adopting the full wafer nanoimprint lithography device comprises the following steps:

1) Pretreatment Process

The mold is fixed the underside of the working table-board of the imprint head through vacuum suction;

2) Imprinting Process

First of all, initial vacuum state is converted into pressure state starting from the center of the mold. The mold generates bendable deformation on the central position under the common effect of the gas-assisted imprint force and capillary force. The mold is locally contacted with the resist on the wafer. The cavity of the central position of the mold is filled by the resist. And then, the vacuum state is gradually converted into pressure state from the mold central location to both sides. The contact area between the structure layer of the mold and the resist is gradually increased until the structure layer of the whole mold is completely contacted with the resist. Furthermore, all cavities of the mold are filled by the liquid resist. Finally, the pressure of all pressure passageways is simultaneously increased, thereby realizing complete filling of the liquid resist into the cavities of the mold. And the residual layer thickness is thinned to the set thickness 3) Curing Process The UV light source is turned on, and the resist is exposed to by UV light source, thereby fully curing the liquid resist;

4) Demolding Process

First of all, the pressure passageway is closed and the vacuum passageway is opened from the outermost sides of the mold, meanwhile, the demolding nozzle is turned on. The mold is mutually detached from the wafer from the outmost side of the mold under the common effect of vacuum suction force of the vacuum passageway and the level detaching force generated by the compressed air from the demolding nozzle. And then, the pressure state is gradually converted into vacuum state from two sides to the center of the mold. The continuous "peel-off" demolding method is carried out from the outside to the center of the mold. Finally, the central position of the mold is detached from the wafer, thereby realizing complete separation between the mold and the wafer, and finishing the demolding process.

The imprinting process and demolding process in step 2) and step 4) take the mold center as axis of symmetry. The imprint process and demolding process are carried out on both sides simultaneously.

The curing time in the step is 20-50 s.

The ultraviolet light source is high-power UV mercury lamp or UV-LEDs with the power of 100-1000 W.

The invention has the following prominent characteristics:

1) The mold used in the invention is a transparent and flexible mold with three-layer composite structure including a structure layer, an elastic layer and a support layer. The replicated pattern is located on the structure layer. The structure layer is made of hard PDMS, thereby reducing local deformation of the mold due to large imprinting pressure, inhomogeneous distribution of the imprinting pressure and non-planar substrate, and ensuring replica accuracy. The middle elastic layer is made of soft PDMS (prone to generate larger longitudinal bending deformation), the longitudinal bending properties of the mold guarantees that the mold and the wafer are well conformal contact, and gradually and evenly contacted during the imprinting pressure on the one hand, which is suitable for non-planar substrate over large areas, and limits the defective area caused by particulate pollutants on the other hand. The rigid support layer guarantees that the mold does not generate horizontal tensile deformation under pressure in the imprinting process on the one hand, and guarantees that the mold can obtain uniform imprinting pressure under the effect of gas-assisted imprint force after the mold is completely contacted with the wafer on the other hand, thereby ensuring the application of uniform imprinting pressure on the entire wafer over a large area.

2) The imprinting process of the invention adopts the strategy of gradually and uniformly micro-contacting from the center to two sides of the mold, and the prominent features and significant advantages are as follows: (1) The imprinting pressure can be reduced as small as possible, large imprinting pressure for traditional full wafer imprinting is avoided, thereby leading to large deformation of the soft mold, and affecting the accuracy and quality of imprinted pattern on the one hand. The imprint process can produce large area patterns on the non-planar surface. (2) The trapped "air bubble" defect can be eliminated. The trapped "air bubble" generated during the imprinting process can be ruled out timely.

3) The invention realizes pattern replication through common effect of the gas-assisted imprinting pressure and the capillary force. The invention has outstanding characteristic and significant advantages as follows: (1) Conformal (intimate) contact between the mold and the non-flat wafer can be easily realized. (2) Homogeneous pressure can be ensured on the full wafer over a large area; (3) Smaller imprinting pressure can be adopted, thereby avoiding the deformation of the soft mold, and improving the quality and accuracy of the replica.

4) The demolding process of the invention adopts the continuous 'peel-off' mode from two sides to the center of the mold. It has the prominent characteristics and significant advantages as follows: (1) The demolding process used in the invention has small demolding force and less damage on the mold which can improve the lifetime of the mold, and can minimize the damage on the reproduced patterns at the same time. Traditional demolding method, which is based directly parallel separation between the mold and the wafer, can generally need large demolding force and easily cause the damage of the mold and imprinted patterns. (2) The demolding force is symmetrically distributed during the demolding process. And the demolding force keeps constant during the entire demolding process. Compared to other demolding methods (the mold is separated from one side to the other side of the mold, or the whole mold is parallel separated at the same time), the invention adopts the continuous 'peel-off' mode from two sides to the center of the wafer to ensure that the center of the mold is detached finally (the site with the largest area). Although the contact area between the template and the substrate at the time is the largest, two sides are completely detached which results in easy separation under small demolding force.

5) This invention realizes continuous 'peel-off' mode from the outside to the center of the mold under common effect of the vacuum suction force and level detaching force from the demolding nozzles. The demolding force is joint force between vacuum suction force and level detaching force. It avoids large detaching force needed for full wafer scale NIL process, and the damage to the mold and imprinted patterns.

6) The imprint process and demolding process of the invention take the template center as axis of symmetry, are carried out at the same time on two sides with high throughput.

7) This invention does not depend upon precise machine which generates homogeneous and uniform imprinting pressure, thereby simplifying the equipment structure.

The invention also has the significant advantages as follows: (1) The invention has the potential ability to realizing full wafer nanoimprint on 8 inch, 12 inch, and even greater wafer. (2) Complete and uniform contact between the mold and the entire wafer can be easily realized for a large area wafer and non-planar substrate.

The invention implements mass production of large-area patterns on the non-planar surface at low cost and high throughput. It can be applied to produce these devices, e.g., high density disks (HDD), micro-optical devices, micro-fluid devices and the like. In particular, it is especially suitable for high volume manufacturing of the photonic crystal LEDs and NPSS.

CONCRETE IMPLEMENTATION

The invention is further described in details through combining attached drawings and embodiments.

Figure 1:
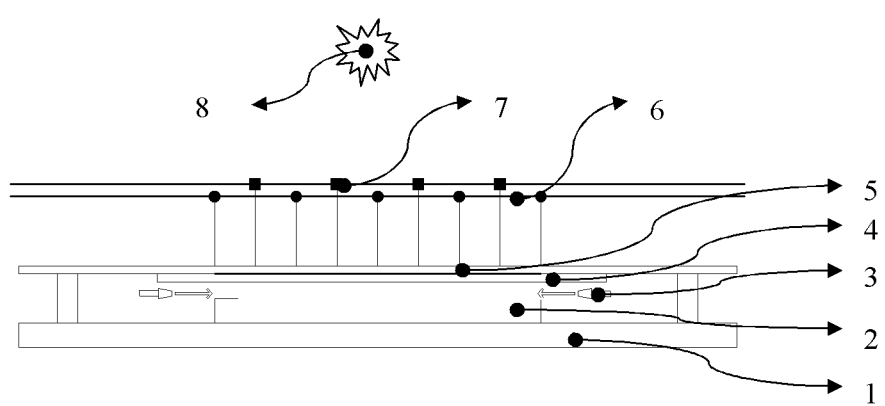
FIG. 1 is the schematic of the full wafer NIL device.

In FIG. 1, the device of the invention comprises these components: a wafer stage 1, a wafer coated with a liquid resist 2, a demolding nozzle 3, a composite mold 4, an imprint head 5, a pressure passageway 6, a vacuum passageway 7 and a UV light source 8, wherein the mold 4 is fixed on the underside of the working table-board of the imprint head 5, the demolding nozzle 3 is arranged at the side of the lower portion of the composite mold 4, the pressure passageway 6 and the vacuum passageway 7 are connected with the air intakes on two sides of the working table-board of the imprint head; the full wafer coated with resist 2 is placed on vacuum chuck on the stage wafer 1, and the UV light source 8 is attached on the working table-board of the imprint head.

Figure 2:
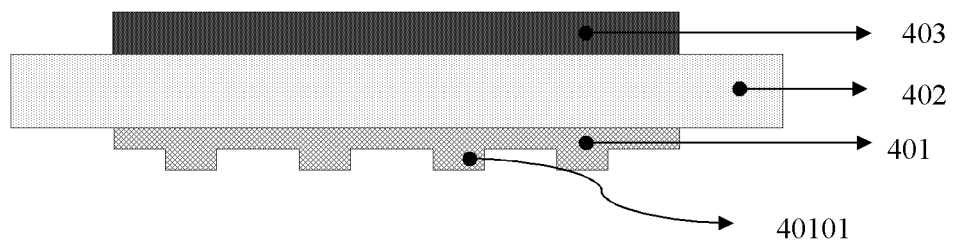
FIG. 2 is the schematic of the composite mold.

In FIG. 2, the composite mold 4 is a transparent and flexible mold with three-layer composite structure. The first layer (the lowest layer) is a structure layer 401. The second layer (middle layer) is an elastic layer 402. And the third layer (the upmost layer) is a support layer 403. Wherein the structure layer 401 contains the nanostructure patterns 40101 which need copying, the elastic layer 402 is located above in structure layer 401, the support layer 403 is located above the elastic layer 402. The thickness of the structure layer 401 is 100-200 microns. The thickness of the elastic layer 402 is 400-700 microns. The thickness of the support layer 403 is 100-200 microns. The structure layer 401, the elastic layer 402 and support layer 403 are made of PDMS with different hardness (elastic modulus).

The structure layer 401 and support layer 403 are made of hard PDMS (polydimethylsiloxane) whose hardness is three to five times of the soft PDMS hardness used in the elastic layer 402. The elastic layer 402 is made of soft PDMS with excellent longitudinal bending deformation property, and the young's modulus is 5 N/mm. The structure layer 401 and support layer 403 have same size, the size of the elastic layer 402 is bigger than the size of the structure layer 401 and support layer 403 by 60 to 150 mm (concrete numerical value can be adjusted based on the specific size of the wafer, the size of the wafer is larger, the numerical value is larger). The elastic layer 402 is fixed underside the working table-board 501 of the imprint head 5, and the support layer 403 is absorbed in the groove 50101 in the working table-board 501 of the imprint head under initial state.

Figure 3A:
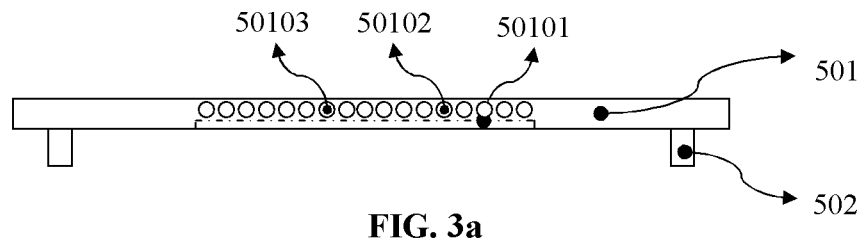
FIG. 3*a* is the schematic of the imprint head in the invention.
Figure 3B:
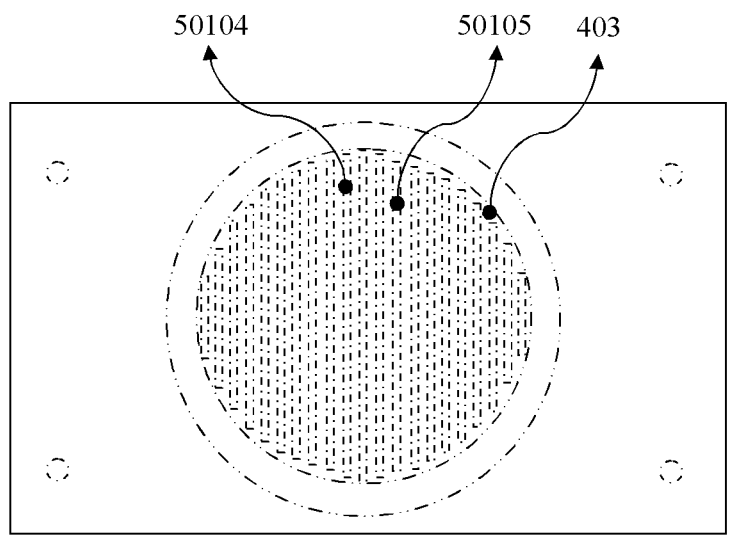
FIG. 3*b* is the top view of FIG. 3*a*.

Schematic diagrams of the imprint head in the invention are shown in FIG. 3a and FIG. 3b. Imprint head 5 has functions in the following three aspects: (1) fixing the composite mold 4; (2) realizing even distribution of pressure and vacuum in the pressure passageway and vacuum passageway during imprint process and demolding process; (3) adjusting the imprint distance (usually 30-150 micron) between the composite mold 4 and the wafer 2 coated with resist. The imprint head 5 comprises a working table-board (also called valve template) 501 and a support adjustment component 502. The working table-board 501 realizes the former two functions, and the support adjustment component 502 realizes the third function. The diameter of the groove 50101 in the working table-board 501 is bigger than the support layer 403 of the mold 4 by 10 mm, the depth size is consistent with the size of the support layer 403 of the composite mold 4, and the elastic layer 402 is fixed on the underside of the working table-board 501. When the elastic layer 402 is fixed on the underside of work table-board 501, the support layer 403 of the mold 4 is attached in the groove 50101 of the working table-board 501 in the initial state, thereby ensuring intimate contact between the mold 4 and the working table-board 501. The insides of pressure passageway round hole array 50102 and the vacuum passageway round hole array 50103 located on two sides of the working table-board 501 are respectively connected with the pressure passageway 50104 and the vacuum passageway 50105 in the working table-board 501. The outsides of pressure passageway round hole array 50102 and the vacuum passageway round hole array 50103 in the working table-board 501 are respectively connected with the pressure passageway 6 and the vacuum passageway 7.

Full wafer scale imprint of GaN-based photonic crystal LEDs with the size of 4 inches (about 100 mm) is taken as an embodiment, the schematic diagram 4 of full wafer nanoimprint lithography process step is combined for describing full wafer nanoimprint process principles and specific process steps in details.

In the embodiment, wafer, mold and some process parameters are set as follows: the wafer is 4-inch GaN-based epitaxial wafer, photonic crystal structure should be imprinted in the p-type semiconductor layer, wherein the geometric parameters of the photonic crystal are as follows: lattice constant is 600 nm, the diameter of the hole is 200 nm, and the depth of hole is 80 nm. Resist adopts mr-UVCur06 from Micro resist technology Company, which is spin-coated on the GaN-based epitaxial wafer for 300 nm. The size of the structure layer 401 and the support layer 403 in the mold 4 is the same as the size of the wafer (diameter is 100 mm), the structure layer 401 and the support layer 403 have the same thickness of 100 micron, and both are made of hard PDMS materials whose hardness is three times higher than that of the elastic layer. The diameter of the elastic layer 402 is 180 mm, the size of elastic layer 40202 is 40 mm, the thickness of the elastic layer is 400 microns, the elastic layer is made of ordinary soft PDMS materials, and the Young's modulus is 5 N/mm. Mold manufacturing adopts traditional manufacturing process of nanoimprint soft PDMS mold. The structure layer 401, the elastic layer 402 and support layer 403 are respectively manufactured through adopting casting (pouring) process (or spin-coat process, or spraying coating process) for three times, firstly, the case mold is spin-coated with liquid hard PDMS materials for manufacturing structure layer 401, then soft liquid PDMS materials is adopted for continuously casting and manufacturing the elastic layer 402, and finally liquid hard PDMS material is cast for manufacturing support layer 403. The master mold for manufacturing structure layer is a silicon mold, nano-pillar array structure is manufactured on a full wafer with the size of 4-inch through adopting interference lithography. The geometric parameters of the nano-pillar are as follows: pitch is 600 nm, cylinder diameter is 200 nm, and the height is 100 nm. The pressure of the pressure passage is 80 mBar.

UV light source 8 adopts high-power ultraviolet mercury lamp with the power of 200 W.

1) Pretreatment Process

Resist with the thickness of 300 nm is evenly spin-coated on the 4-inch GaN epitaxial wafer. Then, the wafer 2 coated with resist is fixed vacuum chuck on the wafer stage 1. The imprint head 5 is aligned with the wafer 2 coated with the resist. The imprint mechanism is lowered until the support regulation component 502 in the working table-board 501 of the imprint head 5 (the height is 80 nm) is contacted with the wafer stage 1. The pressure passageway 6 is closed, the vacuum passageway 7 is opened, and the support layer 403 of the composite mold 4 is attached in the groove 50101 in the working table-board 501 of the imprint head 5.

2) Imprinting Process

Figure 4A:
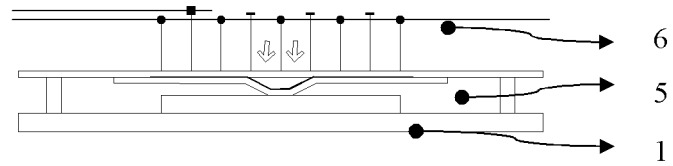
FIG. 4*a* is the schematic of process step of the full wafer nanoimprint lithography process step in the invention.
Figure 4B:
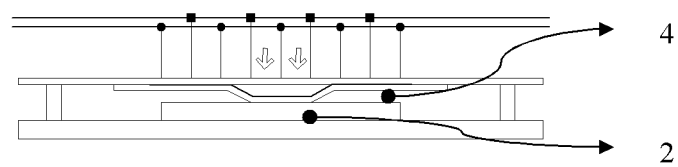
FIG. 4*b* is the schematic of full wafer nanoimprint lithography process step in the invention.
Figure 4C:
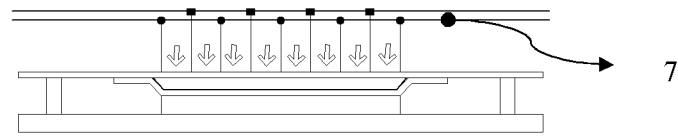
FIG. 4*c* is the schematic of full wafer nanoimprint lithography process step in the invention.

Firstly the initial vacuum state is gradually converted into pressure state from the mold central site to both, the elastic layer 402 generates bending and deformation longitudinally on the central position. The mold is contacted with the resist on the epitaxial wafer, micro-nanostructures (cavities) in the central positions of the mold are filled by the resist under common effect of the gas-assisted imprinting pressure and the capillary force, as shown in FIG. 4a. Subsequently, the vacuum state is converted into pressure state gradually from the central position to two sides of the mold, the contact area between the structure layer 401 of the mold and the resist is gradually increased until the structure layer 401 of the whole mold is completely contacted with the resist on the full field of the wafer. All cavities with micro-nanostructures in the structure layer 401 of the mold are filled by the liquid resist, as shown in FIGS. 4b and 4c. Finally, the pressure of all pressure passageways is simultaneously increased, thereby realizing complete filling of the liquid resist materials in the cavities of the mold, and the residual layer is thinned to predetermined thickness as shown in FIG. 4c.

3) Curing Process

Figure 4D:
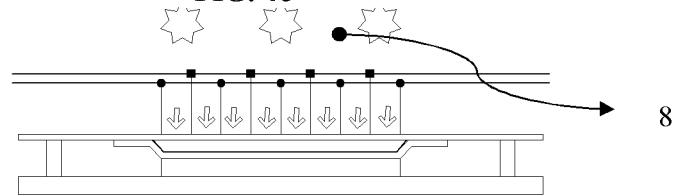
FIG. 4*d* is the schematic of full wafer nanoimprint lithography process step in the invention.

The UV light source 8 is turned on, and UV light is exposed to the resist through the mold 4, thereby fully curing the liquid resist; the curing time lasts for 40 s as shown in FIG. 4d.

4) Demolding Process

Figure 4E:
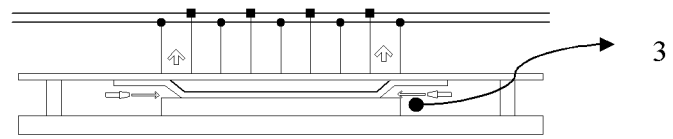
FIG. 4*e* is the schematic of full wafer nanoimprint lithography process step in the invention.
Figure 4F:
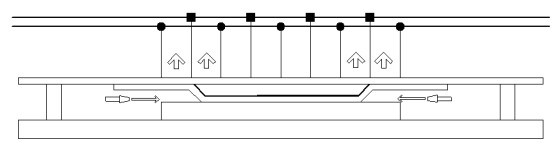
FIG. 4*f* is the schematic of full wafer nanoimprint lithography process step in the invention.
Figure 4G:
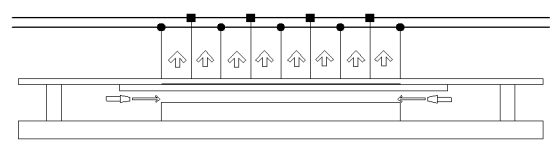
FIG. 4*g* is the schematic of full wafer nanoimprint lithography process step in the invention.

First of all, the pressure passageway is closed and the vacuum passageway is opened from the outermost sides of the mold, meanwhile, the demolding nozzle 3 is opened at the same time, the mold is mutually detached from the wafer from the outmost side under the common effect of vacuum suction force and the level detaching force, as shown in FIG. 4e. Then, the pressure state is gradually converted into vacuum state from two sides of to the center of the mold, thereby realizing continuous 'peel-off' demolding from the outside to the center of the mold. The demolding force is the joint force between vacuum suction force and the level detaching force, as shown in FIG. 4f. Finally, the central position of the mold is separated from the wafer, thereby realizing complete separation between the composite mold and the wafer, and finishing demolding, as shown in FIG. 4g.

In addition, the technical staff in the field also can make other changes within the spirit of the invention, and the changes made on the basis of the invention spirit are included in the scope of the invention required for protection indeed.

What is claimed is:

1. An imprint method adopting a full wafer nanoimprint lithography device including a wafer stage, a wafer coated with a liquid resist, a demolding nozzle, a composite mold, an imprint head, a pressure passageway, a vacuum passageway, and a UV light source, the imprint head including a working table-board, the composite mold is fixed on an underside of the working table-board of the imprint head, the demolding nozzle arranged at one side of a lower portion of the composite mold, the pressure passageway and the vacuum passageway connected with air intakes on two sides of the working table-board of the imprint head, the wafer coated with the liquid resist is placed on vacuum chuck on the wafer stage, the UV light source attached on the working table-board of the imprint head, and the composite mold including a structure layer, an elastic layer, and a support layer, the method comprising:

a pretreatment process comprising fixing the composite mold on the underside of the working table-board of the imprint head through a vacuum state;
  an imprinting process comprising:
    converting the vacuum state into a pressure state starting from a center of the composite mold, wherein the composite mold generates deformation on its central position under common effect of gas-assisted imprinting pressure and capillary force;
    contacting the composite mold with the liquid resist on the wafer, wherein cavity of the central position of the mold is filled by the liquid resist;
    converting the vacuum state into the pressure state from the composite mold central location to both sides of the composite mold, wherein a contact area between the structure layer of the composite mold and the liquid resist is gradually increased until the structure layer of the composite mold is completely contacted with the liquid resist, and wherein all cavities of the composite mold are filled by the liquid resist; and
    increasing the pressure of all pressure passageways simultaneously, thereby realizing complete filling of the liquid resist into the cavities of the composite mold, wherein a residual layer thickness is thinned to a preset thickness;
  a curing process comprising:
    turning on the UV light source, and
    exposing UV light to the liquid resist through the composite mold, thereby fully curing the liquid resist; and
  a demolding process comprising:
    closing the pressure passageway;
    opening the vacuum passageway from outermost sides of the composite mold;
    turning on the demolding nozzle, wherein the composite mold is mutually detached from the wafer from the outmost side of the mold under the common effect of vacuum suction force of the vacuum passageway and the level detaching force generated by the compressed air from the demolding nozzle;
    converting the pressure state gradually into vacuum state from two sides to the center of the mold; and
    detaching the central position of the composite mold from the wafer, thereby realizing complete separation between the composite mold and the wafer.

2. The imprint method of claim 1, wherein the imprinting process and the demolding process are performed simultaneously on opposite sides of the composite mold as axis of symmetry.

3. The imprint method of claim 1, wherein curing time in the curing process is about 20-50 seconds.

4. An imprint method, comprising:
  adopting a full wafer nanoimprint lithography device including a wafer stage, a wafer coated with a liquid resist, a demolding nozzle, a composite mold, an imprint head, a pressure passageway, a vacuum passageway, and a UV light source, the imprint head including a working table-board, the composite mold is fixed on an underside of the working table-board of the imprint head, the demolding nozzle is arranged at one side of a lower portion of the composite mold, the pressure passageway and the vacuum passageway are connected with air intakes on two sides of the working table-board of the imprint head, the wafer coated with the liquid resist is placed on vacuum chuck on the wafer stage, and the UV light source attached on the working table-board of the imprint head; and
  performing with said device:
    a pretreatment process comprising fixing the composite mold on the underside of the working table-board of the imprint head through a vacuum state;
    an imprinting process comprising converting the composite mold from the vacuum state to a pressure state;
    a curing process; and
    a demolding process comprising converting the composite mold from the pressure state to the vacuum, the demolding process comprising:
      closing the pressure passageway;
      opening the vacuum passageway from outermost sides of the composite mold;
      turning on the demolding nozzle, the composite mold mutually detached from the wafer from the outermost side of the mold under the common effect of vacuum suction of the vacuum passageway and level detaching force generated by compressed air from the demolding nozzle;
      converting the pressure state gradually into vacuum state from two sides to the center of the mold; and
      detaching the central position of the composite mold from the wafer, thereby realizing complete separation between the composite mold and the wafer.

5. The imprint method of claim 4, wherein the imprinting process comprises:
  converting the vacuum state into a pressure state starting from a center of the composite mold, wherein the composite mold generates deformation on its central position under common effect of gas-assisted imprinting pressure and capillary force; and wherein the composite mold comprises a structure layer, an elastic layer, and a support layer;
  contacting the composite mold with the liquid resist on the wafer, wherein cavity of the central position of the mold is filled by the liquid resist;
  converting the vacuum state into pressure state from the composite mold central location to both sides of the composite mold, wherein a contact area between the structure layer of the composite mold and the liquid resist is gradually increased until the structure layer of the composite mold is completely contacted with the liquid resist, and wherein all cavities of the composite mold are filled by the liquid resist; and increasing the pressure of all pressure passageways simultaneously, thereby realizing complete filling of the liquid resist into the cavities of the composite mold, wherein a residual layer thickness is thinned to a preset thickness.

6. The imprint method of claim 4, wherein the curing process comprises:

turning on the UV light source; and exposing UV light to the liquid resist through the composite mold, thereby fully curing the liquid resist.

7. The imprint method of claim 4, wherein the imprinting process and the demolding process are carried out on both sides opposite sides of the composite mold as axis of symmetry simultaneously.

8. The imprint method of claim 4, wherein curing time in the curing process is about 20-50 seconds.

* * * * *